United States Patent
Fukushima et al.

(10) Patent No.: US 12,137,522 B2
(45) Date of Patent: Nov. 5, 2024

(54) WIRING CIRCUIT BOARD

(71) Applicant: NITTO DENKO CORPORATION, Osaka (JP)

(72) Inventors: Rihito Fukushima, Osaka (JP); Shusaku Shibata, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 218 days.

(21) Appl. No.: 17/783,537

(22) PCT Filed: Dec. 15, 2020

(86) PCT No.: PCT/JP2020/046742
§ 371 (c)(1),
(2) Date: Jun. 8, 2022

(87) PCT Pub. No.: WO2021/125166
PCT Pub. Date: Jun. 24, 2021

(65) Prior Publication Data
US 2023/0015337 A1    Jan. 19, 2023

(30) Foreign Application Priority Data
Dec. 18, 2019   (JP) .................................. 2019-228698

(51) Int. Cl.
*H05K 1/05*   (2006.01)
*H05K 1/09*   (2006.01)
(Continued)

(52) U.S. Cl.
CPC .............. *H05K 1/181* (2013.01); *H05K 1/05* (2013.01); *H05K 1/09* (2013.01); *H05K 3/32* (2013.01)

(58) Field of Classification Search
CPC ............ H05K 1/05; H05K 3/32; H05K 1/056; H05K 2201/09036; H05K 2203/0369
See application file for complete search history.

(56) References Cited

U.S. PATENT DOCUMENTS 9,241,410 B2 * 1/2016 Ishigaki ................. H05K 3/321
2004/0066617 A1   4/2004 Hirabayashi et al.
(Continued)

FOREIGN PATENT DOCUMENTS

JP     2001-352007 A    12/2001
JP     2003-188338 A    7/2003
(Continued)

OTHER PUBLICATIONS

International Preliminary Report on Patentability issued by WIPO on May 17, 2022, in connection with International Patent Application No. PCT/JP2020/046742.
(Continued)

*Primary Examiner* — Sherman Ng
(74) *Attorney, Agent, or Firm* — Edwards Neils LLC; Jean C. Edwards, Esq.

(57) ABSTRACT

A wiring circuit board includes a mounting region for mounting an electronic element and a circuit region surrounding the mounting region. The mounting region includes a terminal. The circuit region includes a circuit to be electrically connected to the terminal. The circuit region includes a metal support layer, a base insulating layer, and a conductive layer including the circuit. The mounting region does not include the metal support layer and includes a base insulating layer having an opening portion, and the conductive layer including the terminal. The terminal is disposed in the opening portion of the base insulating layer.

11 Claims, 6 Drawing Sheets

(51) Int. Cl.
  *H05K 1/18* (2006.01)
  *H05K 3/32* (2006.01)

(56) References Cited

U.S. PATENT DOCUMENTS

| | | | | |
|---|---|---|---|---|
| 2005/0122627 A1* | 6/2005 | Kanagawa | ............. | G11B 5/486 |
| | | | | 360/245.9 |
| 2009/0096069 A1* | 4/2009 | Ishimaru | ................ | H05K 1/111 |
| | | | | 257/666 |
| 2013/0133939 A1* | 5/2013 | Ishii | ....................... | G11B 5/486 |
| | | | | 174/262 |
| 2015/0156892 A1* | 6/2015 | Tanabe | .................... | C25D 5/02 |
| | | | | 205/125 |
| 2017/0042024 A1* | 2/2017 | Sugimoto | ............. | H05K 1/113 |
| 2020/0075474 A1 | 3/2020 | Takakura et al. | | |
| 2020/0105656 A1 | 4/2020 | Shibata et al. | | |
| 2021/0057296 A1 | 2/2021 | Morita et al. | | |

FOREIGN PATENT DOCUMENTS

| | | |
|---|---|---|
| JP | 2005-302924 A | 10/2005 |
| JP | 2012-109387 A | 6/2012 |
| JP | 2018-164023 A | 10/2018 |
| JP | 2018-166161 A | 10/2018 |
| JP | 2018-190950 A | 11/2018 |
| JP | 2019-068032 A | 4/2019 |
| TW | 201933959 A | 8/2019 |

OTHER PUBLICATIONS

International Search Report issued in PCT/JP2020/046742 on Mar. 16, 2021.
Written Opinion issued in PCT/JP2020/046742 on Mar. 16, 2021.
Office Action, issued by Taiwan Intellectual Property Office on May 3, 2024, in connection with Taiwanese Patent Application No. 109144948.

* cited by examiner

WIRING CIRCUIT BOARD

TECHNICAL FIELD

The present invention relates to a wiring circuit board.

BACKGROUND ART

Conventionally, a wiring board for mounting including a wiring region covering a wiring, and a terminal region covering a terminal has been known (ref: for example, Patent Document 1 below).

In the wiring region of the wiring board for mounting of Patent Document 1, a base insulating layer, a metal wiring, and a cover insulating layer are disposed. In the terminal region of the wiring board for mounting of Patent Document 1, the base insulating layer, the terminal, and the cover insulating layer are disposed, and the surface of the terminal is exposed from the base insulating layer.

In Patent Document 1, an image element is mounted on the terminal region from the front side, and an electrode of the image element is electrically connected to the terminal.

CITATION LIST

Patent Document

Patent Document 1: Japanese Unexamined Patent Publication No. 2019-68032

SUMMARY OF THE INVENTION

Problem to be Solved by the Invention

Although excellent strength of the wiring region is required in accordance with its application and purpose, there is a problem that the wiring board for mounting described in Patent Document 1 may not satisfy the above-described requirements. Further, from the viewpoint of ensuring flatness, there is a case where the image element is desired to be mounted from the rear side of the terminal region.

The present invention provides a wiring circuit board having excellent strength of a circuit region, while capable of mounting an electronic element on the other side in a thickness direction to be electrically connected thereto.

Means for Solving the Problem

The present invention (1) includes a wiring circuit board including a mounting region including a terminal and for mounting an electronic element to be electrically connected to the terminal, and a circuit region including a circuit to be electrically connected to the terminal and surrounding the mounting region, wherein the circuit region includes a metal support layer, a base insulating layer disposed on one surface in a thickness direction of the metal support layer, and a conductive layer disposed at one side in the thickness direction with respect to one surface in the thickness direction of the base insulating layer and including the circuit; the mounting region does not include the metal support layer and includes a base insulating layer having an opening portion, and a conductive layer disposed at one side in the thickness direction with respect to one surface in the thickness direction of the base insulating layer and including the terminal; and the terminal is disposed in the opening portion of the base insulating layer.

In the wiring circuit board, when the electronic element is mounted on the mounting region from the other side in the thickness direction, it is possible to electrically connect the electronic element to the terminal through the opening portion of the base insulating layer.

Further, in the wiring circuit board, unlike the mounting region which does not include the metal support layer, since the circuit region includes the metal support layer, it has excellent strength.

Therefore, according to the wiring circuit board, the circuit region has excellent strength, while the mounting region is capable of mounting the electronic element from the other side in the thickness direction of the wiring circuit board.

The present invention (2) includes the wiring circuit board described in (1), wherein the conductive layer of the mounting region is thinner than the conductive layer of the circuit region.

In the wiring circuit board, since the conductive layer of the mounting region is thinner than the conductive layer of the circuit region, it is possible to reduce the thickness of the mounting region.

The present invention (3) includes the wiring circuit board described in (1) or (2), wherein the base insulating layer of the mounting region is thinner than the base insulating layer of the circuit region.

In the wiring circuit board, since the base insulating layer of the mounting region is thinner than the base insulating layer of the circuit region, it is possible to reduce the thickness of the mounting region.

The present invention (4) includes the wiring circuit board described in any one of (1) to (3), wherein the other surface in the thickness direction of the terminal is exposed toward the other side in the thickness direction.

In the wiring circuit board, since the other surface in the thickness direction of the terminal is exposed toward the other side in the thickness direction, it is possible to reliably connect an electrode of the electronic element to the terminal on the other side in the thickness direction of the wiring circuit board.

The present invention (5) includes the wiring circuit board described in (4), wherein the other surface in the thickness direction of the terminal, and the other surface in the thickness direction of the base insulating layer in the mounting region are flush.

In the wiring circuit board, since the other surface in the thickness direction of the terminal, and the other surface in the thickness direction of the base insulating layer in the mounting region are flush, the mounting of the electronic element is easy.

The present invention (6) includes the wiring circuit board described in any one of (1) to (3), wherein the mounting region further includes an electrically conductive layer in contact with the other surface in the thickness direction of the terminal.

In the wiring circuit board, since the mounting region further includes the electrically conductive layer, it is possible to easily bring the electronic element into contact with the electrically conductive layer. Therefore, it is possible to easily carry out electrical connection of the electronic element to the terminal.

The present invention (7) includes the wiring circuit board described in any one of (1) to (6), wherein the conductive layer of the circuit region includes a second terminal, and one surface in the thickness direction of the second terminal is exposed toward one side in the thickness direction.

The electronic element can be mounted on the wiring circuit board from the other side in the thickness direction, while an external board which is different from the electronic element is mounted on the wiring circuit board from one side in the thickness direction, and the external board and the second terminal can be electrically connected to each other. That is, the wiring circuit board can be connected to each of the electronic element and the external board on each of both sides in the thickness direction thereof.

The present invention (8) includes the wiring circuit board described in any one of (1) to (6), wherein the base insulating layer of the circuit region has a second opening portion, and the conductive layer of the circuit region includes a third terminal disposed in the second opening portion.

In the wiring circuit board, the electronic element can be mounted on the wiring circuit board from one side in the thickness direction, and when the external board which is different from the electronic element is mounted on the wiring circuit board from one side in the thickness direction, it is possible to electrically connect the external board to the second terminal through the second opening portion of the base insulating layer. That is, the wiring circuit board can be connected to the electronic element and the external board on one side (the same side) in the thickness direction thereof.

The present invention (9) includes the wiring circuit board described in (8), wherein the other surface in the thickness direction of the third terminal is exposed toward the other side in the thickness direction.

In the wiring circuit board, since the third terminal is exposed toward the other surface in the thickness direction, it can be reliably connected to the external board which is disposed on the other side in the thickness direction of the wiring circuit board.

The present invention (10) includes the wiring circuit board described in (8), wherein the circuit region further includes a second electrically conductive layer in contact with the other surface in the thickness direction of the third terminal.

In the wiring circuit board, since the circuit region further includes the second electrically conductive layer, the external board can be easily brought into contact with the second electrically conductive layer. Therefore, it is possible to easily carry out electrical connection of the external board to the second terminal.

Effect of the Invention

According to the wiring circuit board of the present invention, a circuit region has excellent strength, while a mounting region is capable of mounting an electronic element from the other side in a thickness direction of the wiring circuit board.

BRIEF DESCRIPTION OF THE DRAWINGS

FIGS. 2A to 2E show production process views of the wiring circuit board shown in FIG. 1:

FIGS. 3F to 3I, subsequent to FIG. 2E, show production process views and specification drawings of the wiring circuit board shown in FIG. 1:

DESCRIPTION OF EMBODIMENTS

One Embodiment

One embodiment of a wiring circuit board of the present invention is described with reference to FIGS. 1 to 3I.

Figure 1:
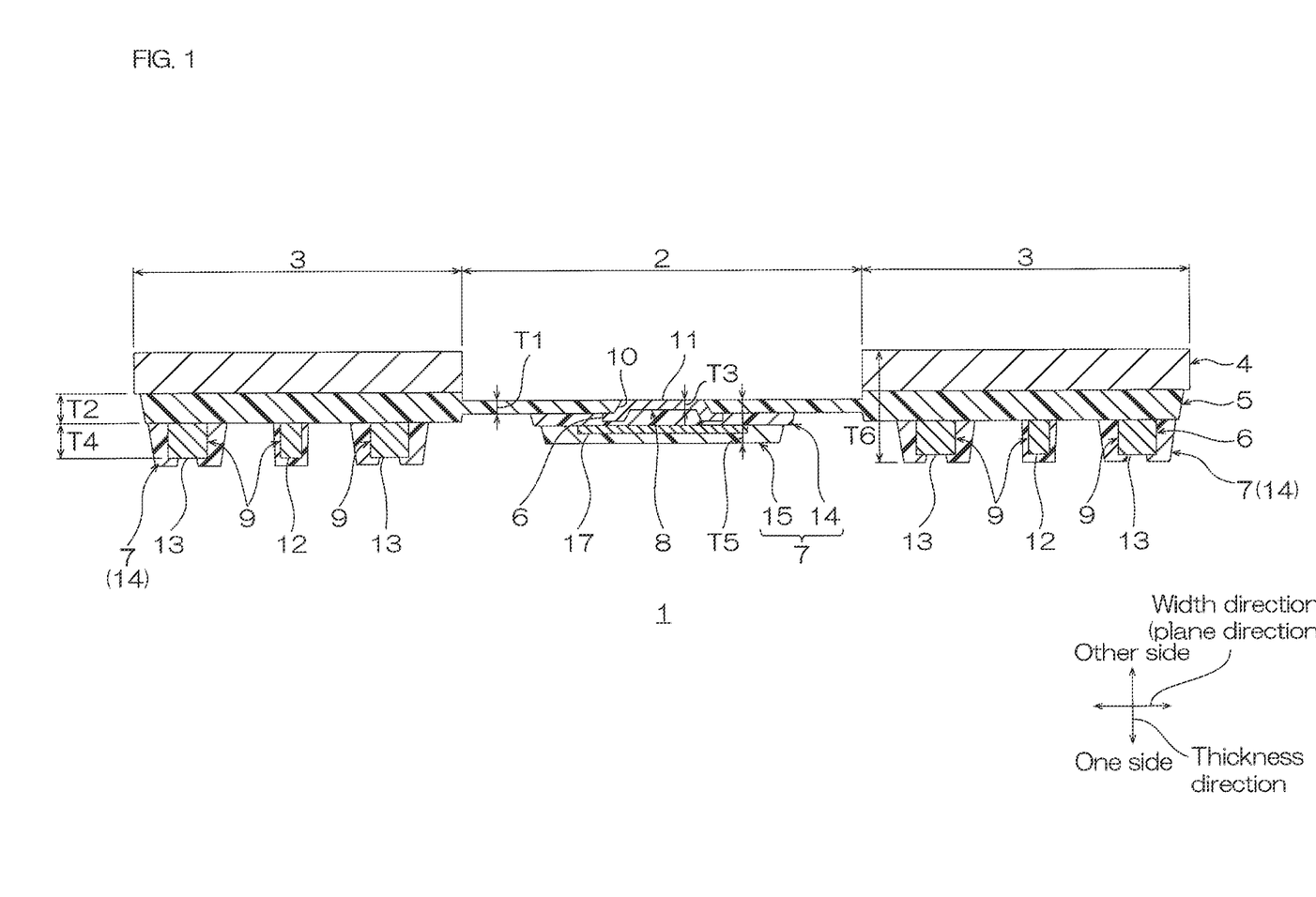
FIG. 1 shows a cross-sectional view of one embodiment of a wiring circuit board of the present invention.

A wiring circuit board 1 has a flat plate shape having a predetermined thickness. The wiring circuit board 1 includes a mounting region 2 and a circuit region 3.

The mounting region 2 is, in a cross section (cross section along a thickness direction, hereinafter the same), located between both end portions in a plane direction (direction perpendicular to the thickness direction and a direction in which a circuit 12 to be described later extends). The mounting region 2 is mounted with an electronic element 31 (ref: FIG. 3I) to be described later.

The circuit region 3 surrounds the mounting region 2. The circuit region 3 is, in a cross section, located in both end portions in the plane direction of the wiring circuit board 1.

Further, the wiring circuit board 1 includes a metal support layer 4, a base insulating layer 5, a conductive layer 6, a cover insulating layer 7, and a second conductive layer 17.

The metal support layer 4 is not included in the mounting region 2, and included in the circuit region 3.

The metal support layer 4 has a flat plate shape in the circuit region 3. The shape of the metal support layer 4 when viewed from the top is the same as that of the circuit region 3. A material for the metal support layer 4 is not particularly limited, and may be any of a transition metal and a typical metal. Specifically, examples of the material for the metal support layer 4 include group 2 metal elements such as calcium, group 4 metal elements such as titanium and zirconium, group 5 metal elements such as vanadium, group 6 metal elements such as chromium, molybdenum, and tungsten, group 7 metal elements such as manganese, group 8 metal elements such as iron, group 9 metal elements such as cobalt, group 10 metal elements such as nickel and platinum, group 11 metal elements such as copper, silver, and gold, group 12 metal elements such as zinc, group 13 metal elements such as aluminum and gallium, and group 14 metal elements such as germanium and tin. These may be used alone or in combination of two or more.

The metal support layer 4 has a thickness of, for example, 10 μm or more, preferably 50 μm or more, and for example, 10 mm or less, preferably 1 mm or less.

The base insulating layer 5 is included in the mounting region 2 and the circuit region 3. The base insulating layer 5 is disposed on one surface in the thickness direction of the metal support layer 4 in the circuit region 3. Further, the base insulating layer 5 is exposed toward both sides in the thickness direction in the mounting region 2.

Further, the base insulating layer 5 of the mounting region 2 has an opening portion 10 in which a terminal 11 to be described later is disposed. The opening portion 10 penetrates the base insulating layer 5 in the thickness direction. The opening portion 10 is located in the central portion in the plane direction of the mounting region 2. An inner-side surface defining the opening portion 10 in the base insulating layer 5 has a cross-sectional tapered shape in which the opening cross-sectional area is gradually reduced toward the other side in the thickness direction.

The base insulating layer 5 of the mounting region 2 is thinner than the base insulating layer 5 of the circuit region 3. Specifically, one surface in the thickness direction of the base insulating layer 5 of the mounting region 2 is located at the other side in the thickness direction with respect to one surface in the thickness direction of the base insulating layer 5 of the circuit region 3. Further, the other surface in the thickness direction of the base insulating layer 5 of the mounting region 2 is located at one side in the thickness direction with respect to the other surface in the thickness direction of the base insulating layer 5 of the circuit region 3. That is, when projected in the plane direction, in the base insulating layer 5, the other surface in the circuit region 3, the other surface in the mounting region 2, one surface in the mounting region 2, and one surface in the circuit region 3 are located in order toward one side in the thickness direction.

The base insulating layer 5 of the mounting region 2 has a thickness T1 of, for example, 20 μm or less, preferably 15 μm or less, more preferably 10 μm or less, and for example, 1 μm or more. The base insulating layer 5 of the circuit region 3 has a thickness T2 of, for example, 1 μm or more, preferably 3 μm or more, more preferably 5 μm or more, and for example, 30 μm or less.

A ratio (T1/T2) of the thickness T1 of the base insulating layer 5 of the mounting region 2 to the thickness T2 of the base insulating layer 5 of the circuit region 3 is, for example, 0.8 or less, preferably below 0.5, more preferably 0.3 or less, and for example, 0.01 or more, preferably 0.1 or more.

Examples of a material for the base insulating layer 5 include insulating resins such as polyimide.

The conductive layer 6 is included in the mounting region 2 and the circuit region 3. The conductive layer 6 is disposed on one surface in the thickness direction of the base insulating layer 5.

The conductive layer 6 includes a terminal pattern 8 and a circuit pattern 9.

The terminal pattern 8 is included in the mounting region 2. The terminal pattern 8 has the terminal 11.

The terminal 11 is disposed in the opening portion 10 of the base insulating layer 5. The terminal 11 has a shape expanding in the plane direction. Specifically, the central portion in the plane direction (central portion surrounded by the peripheral end portion in the plane direction to be described later, hereinafter the same) of the terminal 11 fills the opening portion 10, and the peripheral end portion thereof is disposed on one surface in the thickness direction of the periphery of the opening portion 10 in the base insulating layer 5. The other surface in the thickness direction of the central portion of the terminal 11 is exposed from the base insulating layer 5 toward the other side in the thickness direction. The other surface in the thickness direction of the central portion of the terminal 11 is flush with the other surface in the thickness direction of the base insulating layer 5 of the mounting region 2. Although not shown, the plurality of terminals 11 may be also disposed spaced apart from each other in the plane direction.

The circuit pattern 9 is included in the circuit region 3. The circuit pattern 9 has the circuit 12.

The circuit 12 is, for example, a wiring such as signal wiring and power supply wiring. The circuit 12 extends in the plane direction. The plurality of circuits 12 may be also disposed spaced apart from each other in the plane direction.

Further, the circuit pattern 9 furthermore has a second terminal 13. The second terminal 13 is continuous with the circuit 12 (continuous structure is not shown), thereby being connected to the circuit 12.

Further, the circuit pattern 9 is electrically connected to the terminal pattern 8. Specifically, the circuit 12 is continuous with the terminal 11 (continuous structure is not shown).

Examples of a material for the conductive layer 6 include conductors such as copper, silver, gold, chromium, nickel, and titanium, and alloys of these.

The conductive layer 6 has a thickness of, for example, 1 μm or more, and 1,000 μm or less.

Further, the terminal pattern 8 is thinner than the circuit pattern 9. Specifically, the terminal pattern 8 has a thickness T3 of, for example, 20 μm or less, preferably 10 μm or less, more preferably 5 μm or less, and for example, 1 μm or more. The circuit pattern 9 has a thickness T4 of, for example, 3 μm or more, preferably 5 μm or more, more preferably 10 μm or more, and for example, 30 μm or less. A ratio (T3/T4) of the thickness T3 of the terminal pattern 8 to the thickness T4 of the circuit pattern 9 is, for example, 0.8 or less, preferably below 0.5, more preferably 0.3 or less, and for example, 0.01 or more, preferably 0.1 or more.

In the circuit pattern 9, the thickness of the circuit 12, and the thickness of the second terminal 13 are the same.

The cover insulating layer 7 includes a first cover insulating layer 14 and a second cover insulating layer 15.

The first cover insulating layer 14 is included in the mounting region 2 and the circuit region 3.

The first cover insulating layer 14 in the mounting region 2 is disposed on one surface in the thickness direction of the base insulating layer 5 so as to cover the terminal pattern 8. Specifically, the first cover insulating layer 14 in the mounting region 2 is in contact with one surface in the thickness direction of the terminal 11.

The first cover insulating layer 14 in the circuit region 3 is disposed on one surface in the thickness direction of the base insulating layer 5 so as to cover the circuit pattern 9. The first cover insulating layer 14 is in contact with the peripheral side surface and the peripheral end portion of one surface in the thickness direction of the second terminal 13, and both side surfaces and one surface in the thickness direction of the circuit 12. The first cover insulating layer 14 exposes the central portion of one surface in the thickness direction of the second terminal 13.

The second cover insulating layer 15 is not included in the circuit region 3, and included in the mounting region 2. The second cover insulating layer 15 in the mounting region 2 is disposed on one surface in the thickness direction of the first cover insulating layer 14.

The cover insulating layer 7 has a thickness of, for example, 2 µm or more, and for example, 30 µm or less. Each of the first cover insulating layer 14 and the second cover insulating layer 15 has a thickness of, for example, 1 µm or more, and for example, 15 µm or less.

As the material for the cover insulating layer 7, an insulating resin such as polyimide is used.

The second conductive layer 17 is included in the mounting region 2. The second conductive layer 17 is embedded in the cover insulating layer 7. The second conductive layer 17 is sandwiched between the first cover insulating layer 14 and the second cover insulating layer 15 in the thickness direction. The second conductive layer 17 is disposed on one surface in the thickness direction of the first cover insulating layer 14 so as to be overlapped with the terminal pattern 8 when projected in the thickness direction. The second conductive layer 17 functions as a shield layer for the terminal pattern 8. Examples of a material for the second conductive layer 17 include conductors such as copper, silver, gold, chromium, nickel, and titanium, and alloys of these. The second conductive layer 17 has a thickness of, for example, 10 nm or more, and for example, 10 µm or less.

The mounting region 2 in the wiring circuit board 1 is thinner than the circuit region 3 in the wiring circuit board 1.

A thickness T5 of the mounting region 2 in the wiring circuit board 1 is a distance between the other surface in the thickness direction of the base insulating layer 5 and one surface in the thickness direction of the cover insulating layer 7, and is, for example, 50 µm or less, preferably 40 µm or less, more preferably 25 µm or less, and for example, 1 µm or more. A thickness T6 of the circuit region 3 in the wiring circuit board 1 is a distance between the other surface in the thickness direction of the metal support layer 4 and one surface in the thickness direction of the cover insulating layer 7, and is, for example, above 50 µm, preferably 60 µm or more, more preferably 75 µm or more, and, for example, 1,000 µm or less.

A ratio (T5/T6) of the thickness T5 of the mounting region 2 to the thickness T6 of the circuit region 3 is, for example, 0.8 or less, preferably below 0.5, more preferably 0.3 or less, and for example, 0.01 or more, preferably 0.1 or more.

Next, a method for producing the wiring circuit board 1 is described with reference to FIGS. 2A to 3H.

Figure 2A:
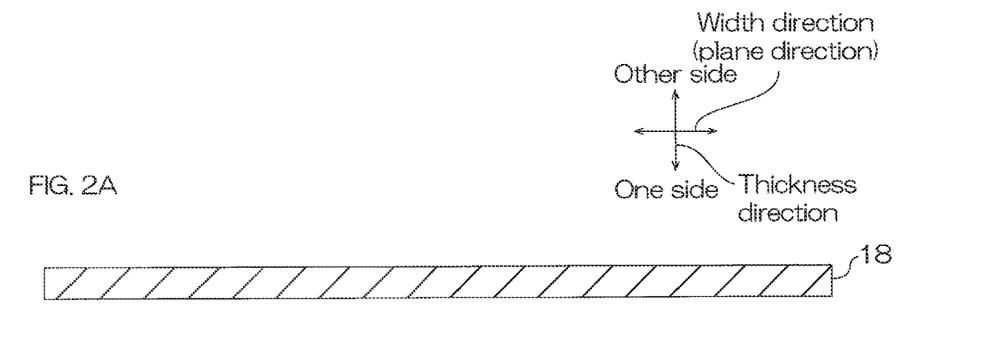
FIG. 2A illustrating a step of preparing a metal sheet.

As shown in FIG. 2A, in this method, first, a metal sheet 18 is prepared. The metal sheet 18 is a sheet extending in the plane direction. The metal sheet 18 is a sheet for forming the metal support layer 4.

Figure 2B:
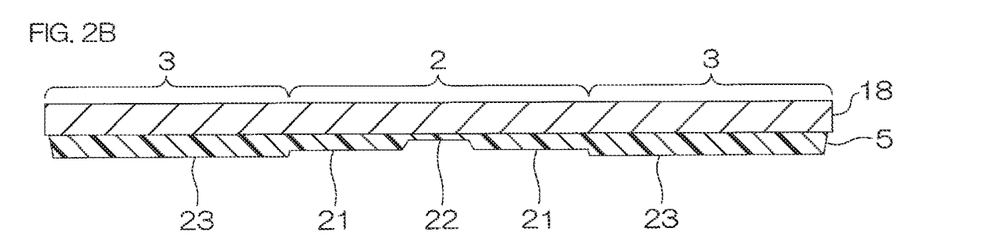
FIG. 2B illustrating a step of forming a base insulating layer.

As shown in FIG. 2B, next, in this method, the base insulating layer 5 is formed on one surface in the thickness direction of the metal sheet 18. For example, a photosensitive varnish containing an insulating resin is applied onto one surface in the thickness direction of the metal sheet 18 to be dried, thereby forming a photosensitive base film. The obtained photosensitive base film is subjected to photolithography, thereby forming the base insulating layer 5. The base insulating layer 5 does not yet have the opening portion 10 (ref: FIG. 3H), and has a first base portion 21, a second base portion 22, and a third base portion 23 having different thicknesses based on gradation exposure in the photolithography. The first base portion 21 and the second base portion 22 are disposed in the mounting region 2. The third base portion 23 is disposed in the circuit region 3. The first base portion 21 is thicker than the second base portion 22. The first base portion 21 is thinner than the third base portion 23.

Figure 2C:
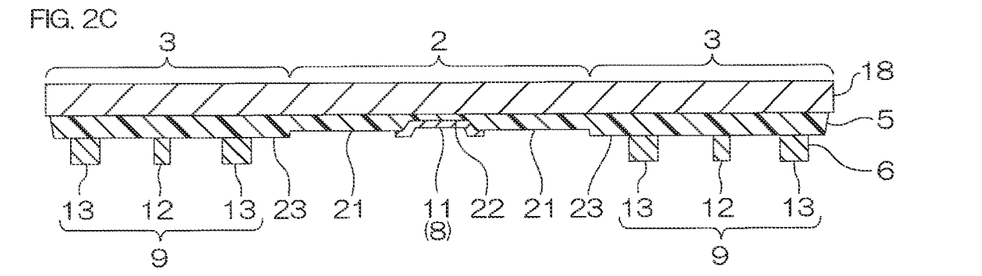
FIG. 2C illustrating a step of forming a conductive layer.

As shown in FIG. 2C, next, in this method, the conductive layer 6 is formed on one surface in the thickness direction of the base insulating layer 5. The conductive layer 6 is formed so as to include the terminal pattern 8 and the circuit pattern 9 by, for example, a pattern forming method such as additive method and subtractive method. For example, first, any one of the terminal pattern 8 and the circuit pattern 9 is formed, and thereafter, the other is formed. In the additive method, first, the terminal pattern 8, and an other-side portion in the thickness direction of the circuit pattern 9 are formed, and next, a one-side portion in the thickness direction of the circuit pattern 9 is laminated. The central portion of the terminal 11 is formed on one surface in the thickness direction of the second base portion 22. The peripheral end portion of the terminal 11 is formed on one surface in the thickness direction of the first base portion 21.

Figure 2D:
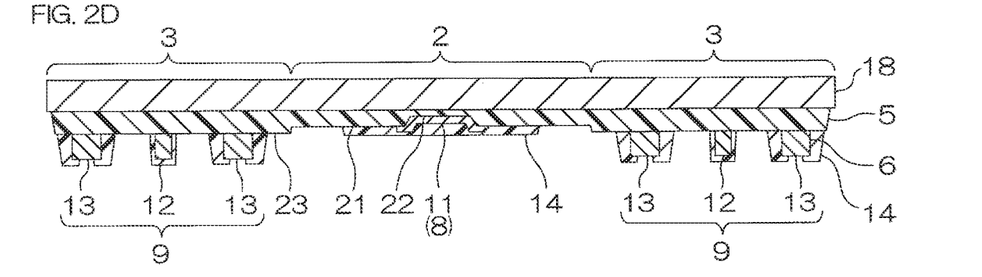
FIG. 2D illustrating a step of forming a first cover insulating layer.

As shown in FIG. 2D, next, in this method, the first cover insulating layer 14 is formed on one surface in the thickness direction of the base insulating layer 5. For example, a photosensitive varnish containing an insulating resin is applied onto one surfaces in the thickness direction of the base insulating layer 5 and the conductive layer 6 to be dried, thereby forming a photosensitive cover film. The obtained photosensitive cover film is subjected to photolithography, thereby forming the first cover insulating layer 14. The first cover insulating layer 14 covers the terminal 11 and the circuit 12. The first cover insulating layer 14 covers the peripheral side surface, and the peripheral end portion of one surface in the thickness direction of the second terminal 13. The first cover insulating layer 14 exposes the central portion of one surface in the thickness direction of the second terminal 13.

Figure 2E:
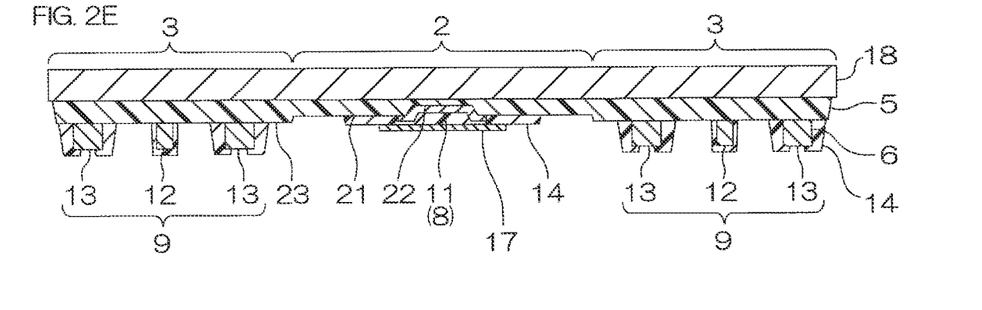
FIG. 2E illustrating a step of forming an electrically conductive layer.

As shown in FIG. 2E, next, in this method, the second conductive layer 17 is formed on one surface in the thickness direction of the first cover insulating layer 14 of the mounting region 2. The second conductive layer 17 is, for example, formed by sputtering, plating, and the like.

Figure 3F:
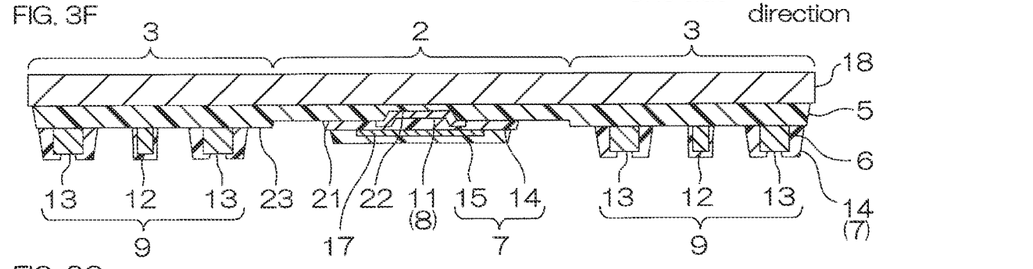
FIG. 3F illustrating a step of forming a second cover insulating layer.

As shown in FIG. 3F, next, in this method, the second cover insulating layer 15 is formed on one surface in the thickness direction of the first cover insulating layer 14 of the mounting region 2 so as to cover the second conductive layer 17. A method for forming the second cover insulating layer 15 is the same as the method for forming the first cover insulating layer 14.

Thus, the cover insulating layer 7 including the first cover insulating layer 14 and the second cover insulating layer 15 is formed.

Figure 3G:
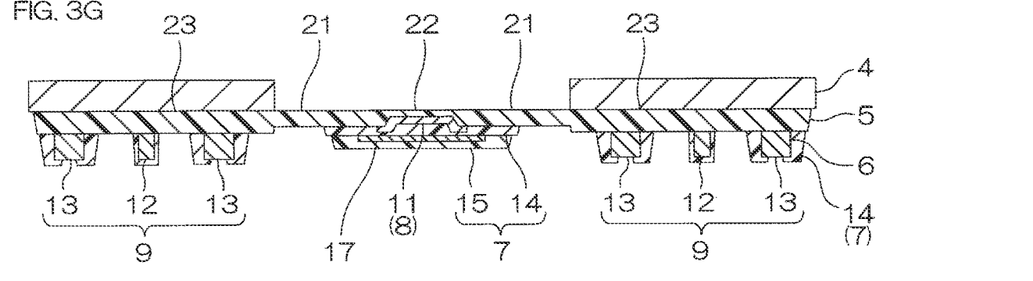
FIG. 3G illustrating a step of forming a metal support layer.
Figure 3H:
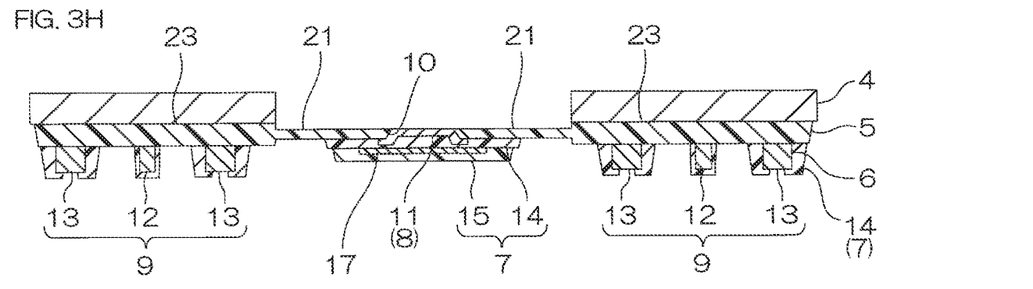
FIG. 3H illustrating a step of exposing a terminal.
Figure 3I:
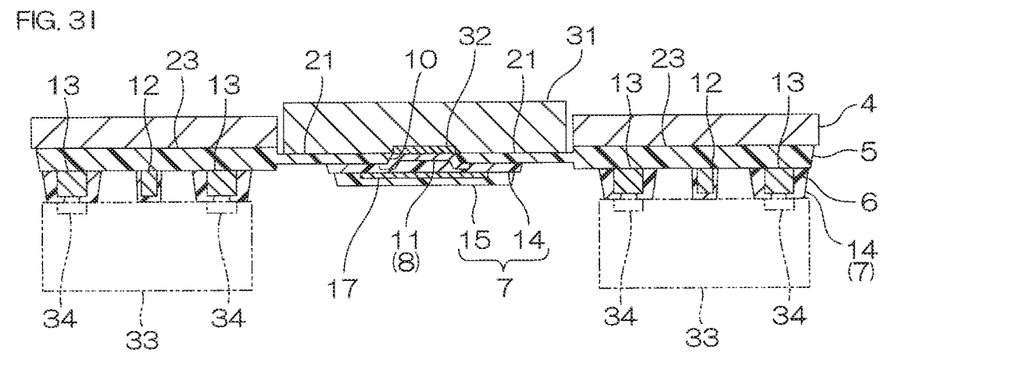
FIG. 3I illustrating a step of mounting an electronic element on a mounting region.

As shown in FIG. 3G, next, in this method, the metal support layer 4 is formed from the metal sheet 18. Specifically, the metal sheet 18 in the mounting region 2 is removed. In order to form the metal support layer 4, the outer shape of the metal sheet 18 is processed by, for example, etching and the like. Thus, the other surface in the thickness direction of the base insulating layer 5 in the mounting region 2 is exposed.

As shown in FIG. 3H, next, in this method, the other-side portion in the thickness direction of the base insulating layer 5 of the mounting region 2 is removed. Thus, the second base portion 22 is removed, and the other-side portion in the thickness direction of the first base portion 21 is removed. The base insulating layer 5 in the mounting region 2 is etched from, for example, the other side in the thickness direction.

By the removal of the second base portion 22, the opening portion 10 is formed in the first base portion 21 of the base insulating layer 5 of the mounting region 2. Thus, the other surface in the thickness direction of the terminal 11 is exposed from the second base portion 22. Further, the base insulating layer 5 of the mounting region 2 is formed from the first base portion 21.

Thus, the wiring circuit board 1 is obtained.

The wiring circuit board 1 is, for example, a board for mounting on which the electronic element 31 is mounted.

Examples of the electronic element 31 include solid image elements such as CMOS sensors and CCD sensors. The electronic element 31 has a flat plate shape. The electronic element 31 has an electrode 32 on one surface in the thickness direction.

Thereafter, the electronic element 31 is mounted on the mounting region 2 from the other side in the thickness direction of the wiring circuit board 1. The electrode 32 and the terminal 11 are electrically connected to each other. The electronic element 31 is overlapped with the mounting region 2, and is not overlapped with the circuit region 3 when projected in the thickness direction. On the other hand, the electronic element 31 is overlapped with the metal support layer 4 when projected in the plane direction.

Furthermore, an external board 33 shown by a phantom line can be mounted on the circuit region 3 from one side in the thickness direction of the wiring circuit board 1. The external board 33 has a terminal 34 on the other surface in the thickness direction. The terminal 34 of the external board 33 and the second terminal 13 are electrically connected to each other.

(Function and Effect of One Embodiment)

Then, in the wiring circuit board 1, the electronic element 31 is mounted on the mounting region 2 from the other side in the thickness direction, and it is possible to electrically connect the electrode 32 of the electronic element 31 to the terminal 11 through the opening portion 10 of the base insulating layer 5.

Further, in the wiring circuit board 1, unlike the mounting region 2 which does not include the metal support layer 4, since the circuit region 3 includes the metal support layer 4, it has excellent strength. Then, even when the external board 33 is mounted on the circuit region 3, it is possible to strongly support it.

Therefore, according to the wiring circuit board 1, the circuit region 3 has excellent strength, while the mounting region 2 is capable of mounting the electronic element 3 from the other side in the thickness direction of the wiring circuit board 1.

In the wiring circuit board 1, since the terminal pattern 8 of the mounting region 5 is thinner than the circuit pattern 9 of the circuit region 3, it is possible to reduce the thickness of the mounting region 2.

In the wiring circuit board 1, since the base insulating layer 5 of the mounting region 2 is thinner than the base insulating layer 5 of the circuit region 3, it is possible to reduce the thickness of the mounting region 2.

In the wiring circuit board 1, since the other surface in the thickness direction of the terminal 11 is exposed toward the other side in the thickness direction, it is possible to reliably connect the electrode 32 of the electronic element 31 to the terminal 31 on the other side in the thickness direction of the wiring circuit board 1.

In the wiring circuit board 1, since the other surface in the thickness direction of the terminal 11, and the other surface in the thickness direction of the base insulating layer 5 in the mounting region 2 are flush, the mounting of the electronic element 31 is easy.

In the wiring circuit board 1, the electronic element 31 can be mounted on the wiring circuit board 1 from the other side in the thickness direction, while the external board 33 can be mounted on the wiring circuit board 1 from one side in the thickness direction. That is, the wiring circuit board 1 can be connected to each of the electronic element 31 and the external board 33 on each of both sides in the thickness direction thereof.

Modified Examples

In each modified example below, the same reference numerals are provided for members and steps corresponding to each of those in the above-described one embodiment, and their detailed description is omitted. Each modified example can achieve the same function and effect as that of one embodiment unless otherwise specified. Furthermore, one embodiment and the modified example thereof can be appropriately used in combination.

Although not shown, the terminal pattern 8 may be thicker than, or may have the same thickness as the circuit pattern 9. Preferably, as in one embodiment, the terminal pattern 8 is thinner than the circuit pattern 9. Thus, it is possible to reduce the thickness of the mounting region 2.

Further, though not shown, the base insulating layer 5 of the mounting region 2 may be thicker than, or may have the same thickness as the base insulating layer 5 of the circuit region 3. Preferably, as in one embodiment, the base insulating layer 5 of the mounting region 2 is thinner than the base insulating layer 5 of the circuit region 3. Thus, it is possible to reduce the thickness of the mounting region 2.

Further, though not shown, the wiring circuit board 1 may not include the second conductive layer 17. In this case, the cover insulating layer 7 consists of one layer.

Figure 4:
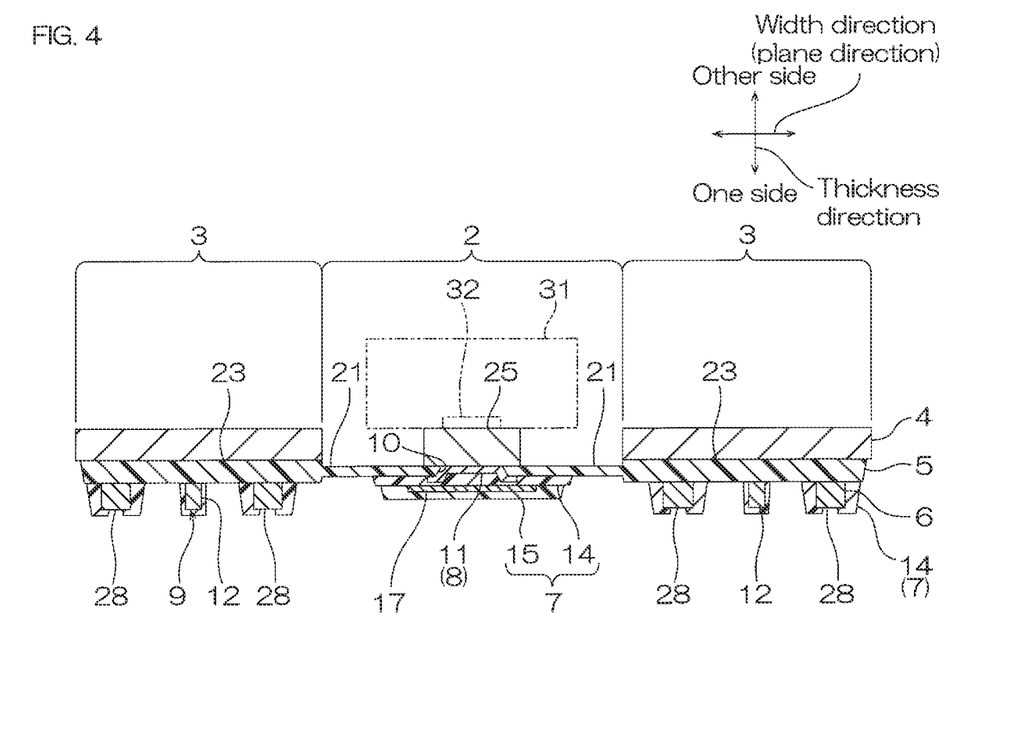
FIG. 4 shows a cross-sectional view of a modified example (embodiment in which a mounting region further includes an electrically conductive layer) of the wiring circuit board shown in FIG. 1.

As shown in FIG. 4, in the wiring circuit board 1, the mounting region 2 further includes an electrically conductive layer 25 in contact with the other surface in the thickness direction of the terminal 11.

The electrically conductive layer 25 is in contact with the entire other surface in the thickness direction of the terminal 11, and the other surface in the thickness direction of the periphery of the opening portion 10 in the base insulating layer 5. The electrically conductive layer 25 has a flat plate shape. The electrically conductive layer 25 is spaced apart from the metal support layer 4 of the circuit region 3. The electrically conductive layer 25 is electrically independent of the metal support layer 4. Specifically, the electrically conductive layer 25 is, in a cross section, surrounded by the metal support layer 4 of the circuit region 3 at spaced intervals thereto. Examples of a material for the electrically conductive layer 25 include conductors such as copper, silver, gold, chromium, nickel, and titanium, and alloys of these. Preferably, the material for the electrically conductive layer 25 is the same as that for the metal support layer 4.

For example, the electrically conductive layer 25 is formed by processing the outer shape of the metal sheet 18 shown in FIG. 2A. Specifically, the electrically conductive layer 25 is formed at the same timing as the metal support layer 4. Therefore, the electrically conductive layer 25 is the same layer as the metal support layer 4, and has the same thickness.

Alternatively, the electrically conductive layer 25 may be also formed at different timing from the metal support layer 4, and may be a layer which is different from the metal support layer 4. For example, after forming the metal support layer 4, separately, the electrically conductive layer 25 is formed on the other surface in the thickness direction of the terminal 11. In that case, the electrically conductive layer 25 has a thickness which is different from that of the metal support layer 4.

The electrically conductive layer 25 has a thickness of preferably 1 µm or more, and preferably 200 µm or less.

In the wiring circuit board 1 shown in FIG. 4, since the mounting region 2 further includes the electrically conductive layer 25, it is possible to easily bring the electrode 32 of the electronic element 31 into contact with the electrically conductive layer 25. Therefore, it is possible to easily carry out electrical connection of the electrode 32 to the terminal 11.

Figure 5:
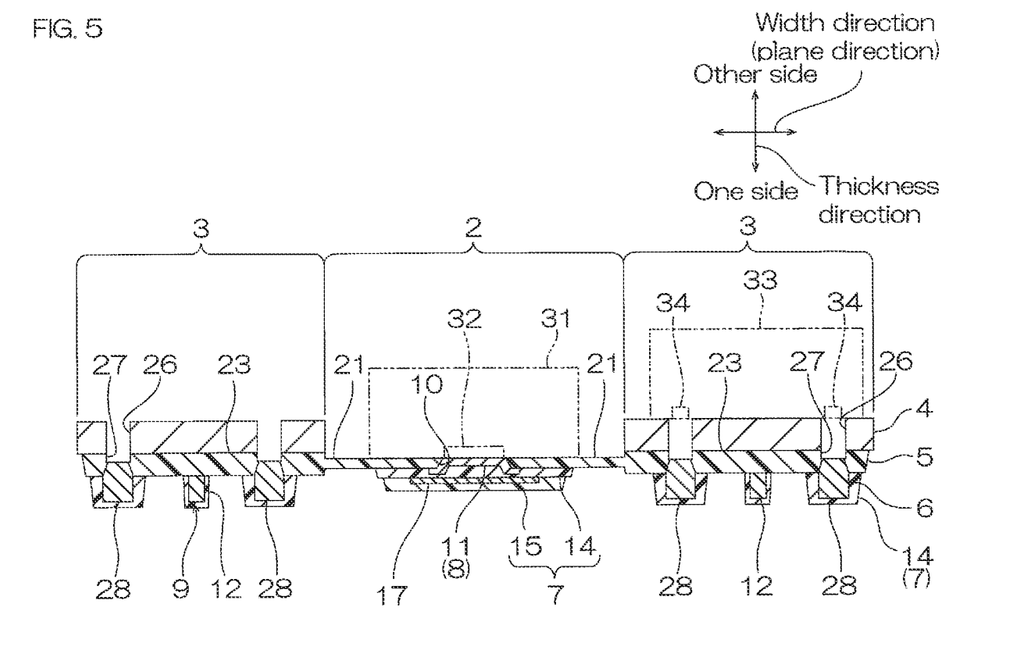
FIG. 5 shows a cross-sectional view of a modified example (embodiment in which a circuit region includes a third terminal exposed toward one side in a thickness direction) of the wiring circuit board shown in FIG. 1.

As shown in FIG. 5, in the wiring circuit board 1, the circuit pattern 9 includes a third terminal 28 exposed toward the other side in the thickness direction instead of the second terminal 13 exposed toward one side in the thickness direction (ref. FIG. 1).

The metal support layer 4 of the circuit region 3 has a metal opening portion 26. The metal opening portion 26 penetrates the metal support layer 4 in the thickness direction.

The base insulating layer 5 of the circuit region 3 includes a second opening portion 27 which communicates with the metal opening portion 26. The third terminal 28 is disposed in the one-side portion in the thickness direction of the second opening portion 27. The second opening portion 27 exposes the other surface in the thickness direction of the third terminal 28.

That is, the metal opening portion 26 and the second opening portion 27 expose the other surface in the thickness direction of the third terminal 28.

In the wiring circuit board 1 shown in FIG. 5, the electronic element 31 can be mounted on the wiring circuit board 1 from the other side in the thickness direction, and when the external board 33 is mounted on the wiring circuit board 1 from the other side in the thickness direction, it is possible to electrically connect the external board 33 to the third terminal 28 through the second opening portion 27 of the base insulating layer 5. That is, the wiring circuit board 1 can be connected to the electronic element 31 and the external board 33 on the other side (the same side) in the thickness direction thereof.

Further, since the third terminal 28 is exposed toward the other surface in the thickness direction, it can be reliably connected to the external board 33 which is disposed on the other side in the thickness direction of the wiring circuit board 1.

Figure 6:
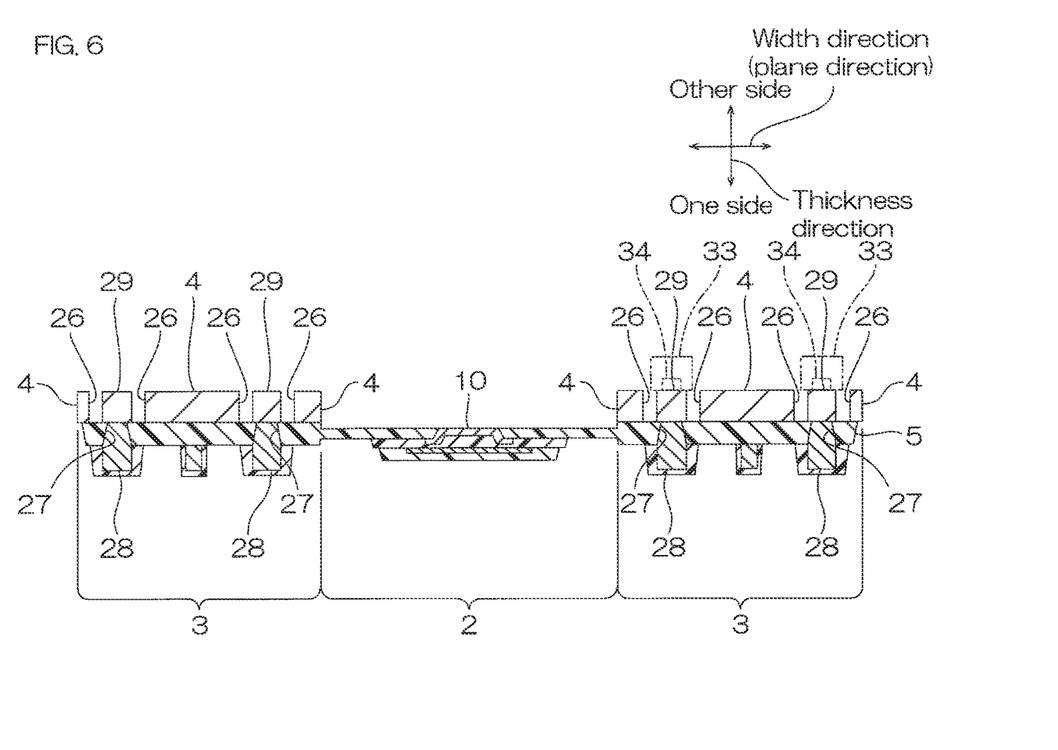
FIG. 6 shows a cross-sectional view of a modified example (embodiment in which a circuit region further includes a second electrically conductive layer) of the wiring circuit board shown in FIG. 1.

In the wiring circuit board 1 shown in FIG. 6, the circuit region 3 further includes a second electrically conductive layer 29 in contact with the other surface in the thickness direction of the third terminal 28.

The second electrically conductive layer 29 in in contact with the entire other surface in the thickness direction of the third terminal 28, and the other surface in the thickness direction of the periphery of the second opening portion 27 in the base insulating layer 5. The second electrically conductive layer 29 has a flat plate shape. The second electrically conductive layer 29 is, in a cross section, spaced apart from the peripheral metal support layer 4 in the circuit region 3. The second electrically conductive layer 29 is electrically independent of the metal support layer 4. Examples of a material for the second electrically conductive layer 29 include conductors such as copper, silver, gold, chromium, nickel, and titanium, and alloys of these. Preferably, the material for the second electrically conductive layer 29 is the same as that for the metal support layer 4.

For example, the second electrically conductive layer 29 is formed by processing the outer shape of the metal sheet 18 shown in FIG. 2A. Specifically, the second electrically conductive layer 29 is formed at the same timing as the metal support layer 4. Therefore, the second electrically conductive layer 29 is the same layer as the metal support layer 4, and has the same thickness.

Alternatively, the second electrically conductive layer 29 may be also formed at different timing from the metal support layer 4, and may be a layer which is different from the metal support layer 4. For example, after forming the metal support layer 4, separately, the second electrically conductive layer 29 is formed on the other surface in the thickness direction of the third terminal 28. In that case, the second electrically conductive layer 29 has a thickness which is different from that of the metal support layer 4. The second electrically conductive layer 29 has a thickness of preferably 1 µm or more, and preferably 200 µm or less.

In the wiring circuit board 1 shown in FIG. 6, since the circuit region 3 further includes the second electrically conductive layer 29, the terminal 34 of the external board 33 can be easily brought into contact with the second electrically conductive layer 29. Therefore, it is possible to easily carry out electrical connection of the terminal 34 of the external board 33 to the third terminal 28.

Figure 7:
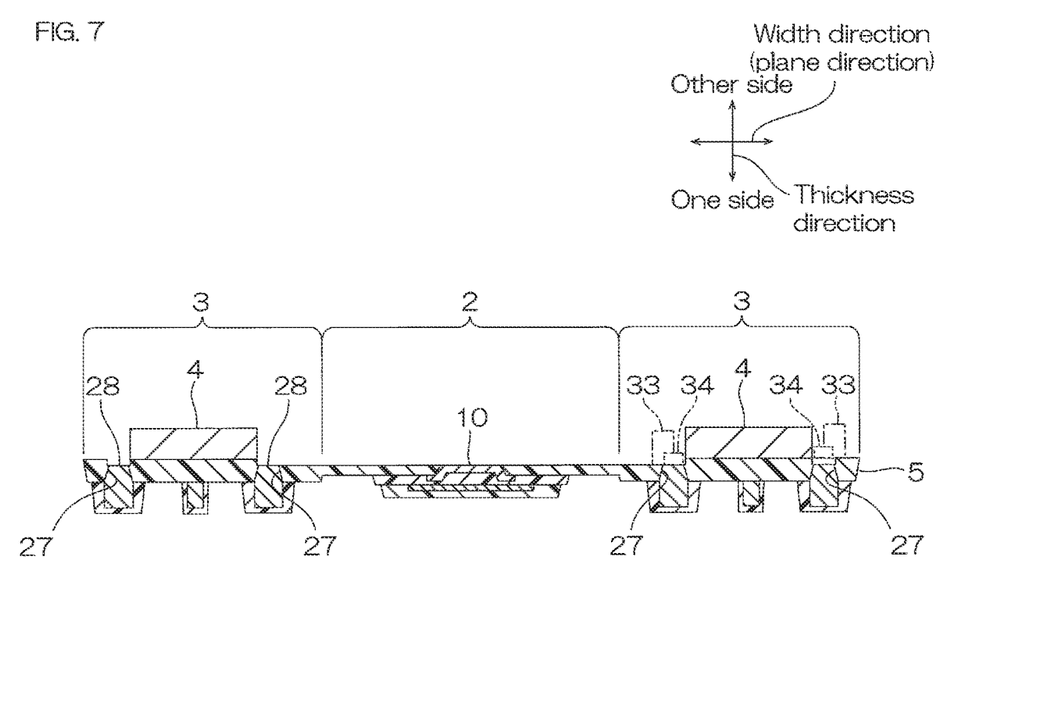
FIG. 7 shows a cross-sectional view of a further modified example of the wiring circuit board shown in FIG. 6.

In the wiring circuit board 1 shown in FIG. 7, in the circuit region 3 which is located outside in the plane direction of the mounting region 2, the metal support layer 4 is disposed between the two third terminals 28. Specifically, the other surface in the thickness direction of the base insulating layer 5 of the circuit region 3 is, in a cross section, exposed outside the third terminal 28 which is located outside the metal support layer 4. Further, the other surface in the thickness direction of the base insulating layer 5 of the circuit region 3 is, in a cross section, exposed inside the third terminal 28 which is located inside the metal support layer 4.

In the wiring circuit board 1 shown in FIG. 7, it is easy to connect the external board 33 to the third terminal 28.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for connection to an external board.

DESCRIPTION OF REFERENCE NUMERALS

1 Wiring circuit board
2 Mounting region
3 Circuit region
4 Metal support layer
5 Base insulating layer
6 Conductive layer
11 Terminal
12 Circuit
13 Second terminal
25 Electrically conductive layer
27 Second opening portion
28 Third terminal
29 Second electrically conductive layer
31 Electronic element

The invention claimed is:

1. A wiring circuit board comprising:
a mounting region including a terminal, the mounting region which mounts an electronic element to be electrically connected to the terminal, and
a circuit region including a circuit to be electrically connected to the terminal and surrounding the mounting region,
wherein the circuit region includes:
  a metal support layer,
  a base insulating layer disposed on one surface in a thickness direction of the metal support layer, and
  a conductive layer disposed at one side in the thickness direction with respect to one surface in the thickness direction of the base insulating layer and including the circuit;
wherein the mounting region does not include the metal support layer, and includes:
  a base insulating layer having an opening portion, and
  a conductive layer disposed at one side in the thickness direction with respect to one surface in the thickness direction of the base insulating layer and including the terminal; and
  wherein the terminal is disposed in the opening portion of the base insulating layer.

2. The wiring circuit board according to claim 1, wherein the conductive layer of the mounting region is thinner than the conductive layer of the circuit region.

3. The wiring circuit board according to claim 1, wherein the base insulating layer of the mounting region is thinner than the base insulating layer of the circuit region.

4. The wiring circuit board according to claim 1, wherein the other surface in the thickness direction of the terminal is exposed toward the other side in the thickness direction.

5. The wiring circuit board according to claim 4, wherein the other surface in the thickness direction of the terminal, and the other surface in the thickness direction of the base insulating layer in the mounting region are flush.

6. The wiring circuit board according to claim 1, wherein the mounting region further includes an electrically conductive layer in contact with the other surface in the thickness direction of the terminal.

7. The wiring circuit board according to claim 1, wherein the conductive layer of the circuit region includes a second terminal, and
one surface in the thickness direction of the second terminal is exposed toward one side in the thickness direction.

8. The wiring circuit board according to claim 1, wherein the base insulating layer of the circuit region has a second opening portion, and
the conductive layer of the circuit region includes a third terminal disposed in the second opening portion.

9. The wiring circuit board according to claim 8, wherein the other surface in the thickness direction of the third terminal is exposed toward the other side in the thickness direction.

10. The wiring circuit board according to claim 8, wherein the circuit region further includes a second electrically conductive layer in contact with the other surface in the thickness direction of the third terminal.

11. The wiring circuit board according to claim 1, wherein the base insulating layer of the mounting region is exposed toward both sides in the thickness direction.

* * * * *